United States Patent [19]
Kazarian

[11] Patent Number: 5,838,584
[45] Date of Patent: Nov. 17, 1998

[54] OPTIMIZING CHAIN PLACEMENT IN A PROGRAMMABLE LOGIC DEVICE

[75] Inventor: Peter J. Kazarian, Cupertino, Calif.

[73] Assignee: Altera Corporation, San Jose, Calif.

[21] Appl. No.: 825,838

[22] Filed: Apr. 4, 1997

Related U.S. Application Data

[63] Continuation of Ser. No. 379,060, Jan. 27, 1995, abandoned.

[51] Int. Cl.⁶ .................................................. H01L 25/10
[52] U.S. Cl. ............................................................ 364/491
[58] Field of Search .................................... 364/488, 489, 364/490, 491; 326/39, 40; 365/185.22

[56] References Cited

U.S. PATENT DOCUMENTS

| | | | |
|---|---|---|---|
| 4,617,479 | 10/1986 | Hartmann et al. | 307/465 |
| 4,871,930 | 10/1989 | Wong et al. | 307/465 |
| 4,930,107 | 5/1990 | Chan et al. | 365/185.22 |
| 5,128,871 | 7/1992 | Schmitz | 326/39 |
| 5,224,056 | 6/1993 | Chene et al. | 364/491 |
| 5,241,224 | 8/1993 | Pedersen et al. | 307/465 |
| 5,260,611 | 11/1993 | Cliff et al. | 307/465 |
| 5,309,371 | 5/1994 | Shikata et al. | 364/491 |
| 5,469,003 | 11/1995 | Kean | 326/40 |
| 5,513,124 | 4/1996 | Trimberger et al. | 364/490 |
| B1 4,617,479 | 9/1993 | Hartmann et al. | 307/465 |

OTHER PUBLICATIONS

Altera Corporation, Altera Data Book, "MAX+PLUS II, Programmable Logic Development System and Software," pp. 437–452, Aug. 1993, ver. 4.

*Primary Examiner*—Kevin J. Teska
*Assistant Examiner*—Dan Fiul
*Attorney, Agent, or Firm*—Townsend and Townsend and Crew LLP

[57] ABSTRACT

A technique is used to implement chains into a programmable logic device. In one embodiment, the method includes solving a bin packing problem (step 105), test-placing a chain in each logic element position (step 401), forming groups of unused logic element positions (step 405), determining whether future chains can be placed in these remaining unused logic element positions (step 410), comparing each placement against a previously stored placement, and storing the logic element position of the more efficient logic element positions have been checked (step 210). In the end, a substantially optimum placement for each chain is found.

27 Claims, 3 Drawing Sheets

OPTIMIZING CHAIN PLACEMENT IN A PROGRAMMABLE LOGIC DEVICE

This is a continuation of application Ser. No. 08/379,060, filed Jan. 27, 1995, now abandoned, the disclosure of which is incorporated herein by reference.

COPYRIGHT NOTICE

A portion of the disclosure of this patent document contains material which is subject to copyright protection. The copyright owner has no objection to the xerographic reproduction by anyone of the patent document or the patent disclosure in exactly the form it appears in the Patent and Trademark Office patent file or records, but otherwise reserves all copyright rights whatsoever.

APPENDIX

Appendix A comprising 10 pages is included in this application.

BACKGROUND OF THE INVENTION

The present invention relates to the field of programmable logic. More specifically, the present invention provides a method of implementing logical functions in a programmable logic device, especially for design characteristics having chains.

Programmable Logic Devices (PLDs) are well known to those in the electronic art. Such programmable logic devices are commonly referred as PALs (Programmable Array Logic), PLAs (Programmable Logic Arrays), FPLAs (Field Programmable Logic Arrays), PLDs (Programmable Logic Devices), EPLDs (Erasable Programmable Logic Devices), EEPLDs (Electrically Erasable Programmable Logic Devices), LCAs (Logic Cell Arrays), FPGAs (Field Programmable Gate Arrays), and the like. Such devices are used in a wide array of applications where it is desirable to program standard, off-the-shelf devices for a specific application. Such devices include, for example, the well-known, Classic™ EPLDs and MAX® 5000 EPLDs made by Altera® Corporation.

While such devices have met with substantial success, such devices also meet with certain limitations. For example, one such limitation occurs when programming programmable logic devices with design characteristics having chains. Chains commonly arise when implementing such logic functions as adders, registers, barrel shifters, arithmetic logic unit blocks. As used herein, a "chain" refers to a series of logic elements which, when programmed, perform a logic function in a serial manner.

To program a chain into a programmable logic device, each chain takes up a particular number of logic element positions. Unless a special chaining path is provided, most programmable logic devices only allow the chaining of adjacent logic element positions. For example, a chain of four cells will take up four adjacent (or consecutive) logic element positions. However, each logic array block has a set number of logic elements. Therefore, depending upon where a chain is placed in the logic array block, a placement of a chain in a logic array block may block other chains from being placed in the same logic array block, thus reducing the packing efficiency and density of the programmable logic device.

For example, assume a logic array block has eight logic element positions, as shown in FIG. 1A. Assume further there are two chains of four cells each which need to be placed. If the first chain is placed in logic element positions 3, 4, 5, and 6 of the logic array block, this will prevent the second chain from being placed in the same logic array block since logic element positions 1 and 2 and logic element position 7 and 8 remain unallocated, but the second chain has four cells, which will not fit into either of these positions.

As can be seen, an improved technique of programming design characteristics having chains into a programmable logic device is needed.

SUMMARY OF THE INVENTION

An improved method of programming a programmable logic device is provided by virtue of the present invention. The present invention is to program chains into a programmable logic device. The present invention provides a method for placing chains into a logic array block so that each placement reduces restrictions on the placement of future chains. In one embodiment, the method includes placing a chain in each logic element position, forming groups of unused logic element positions, determining whether future chains can be placed in these remaining unused logic element positions, comparing each placement against a previously stored placement, and storing the logic element position of the more efficient logic element placement. These steps are repeated until all logic element positions are checked. In the end, a substantially optimum placement (where the number of chains placeable in a logic array block is substantially maximized) for each chain is found.

More specifically, in accordance with the teachings of this invention, a method of implementing logical functions in a programmable logic device is provided including the steps: inputting design characteristics, the design characteristics defining a plurality of chains, into a programmed digital computer; in the programmed digital computer, solving a bin packing problem for the design characteristics after each chain placement; programming the programmable logic device with a result of the solving step; and using the programmable logic device to implement the logical functions.

In another embodiment, a method of implementing logical functions in a programmable logic device is provided including the steps of: inputting design characteristics, said design characteristics comprising a plurality of chains, into a programmed digital computer; solving a bin packing problem for the design characteristics after each chain placement to produce an optimized design; and programming the programmable logic device with the optimized design. The solving step of the method of the present invention, in one embodiment, includes the steps of: determining whether placing a chain of the design characteristics at one of the logic element positions will block future chains from being placed; and repeating the determining step until a number of chains placeable in the logic array block is substantially maximized (or the logic element positions are substantially occupied).

Other objects, features, and advantages of the present invention will become apparent upon consideration of the following detailed description and the accompanying drawings, in which like reference designations represent like features throughout the figures.

DETAILED DESCRIPTION OF THE PREFERRED EMBODIMENTS

Programmable logic devices are well known to those of skill in the art. One such device provides for an array of AND gates or product terms with programmable inputs, such as described in U.S. Pat. No. 4,617,479, assigned to the assignee of the present invention and incorporated herein by reference for all purposes. Another such device is described in U.S. Pat. No. 5,260,610, assigned to the assignee of the present invention and incorporated herein by reference for all purposes.

Figure 1A:
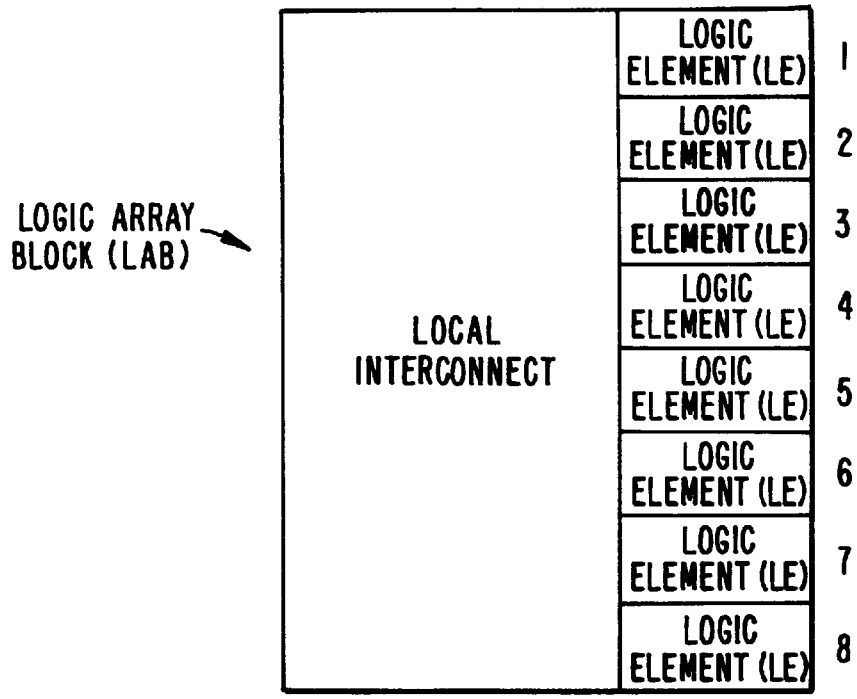
FIGS. 1A–B are block diagrams of logic array blocks (LABs) with logic elements (LEs)
Figure 1B:
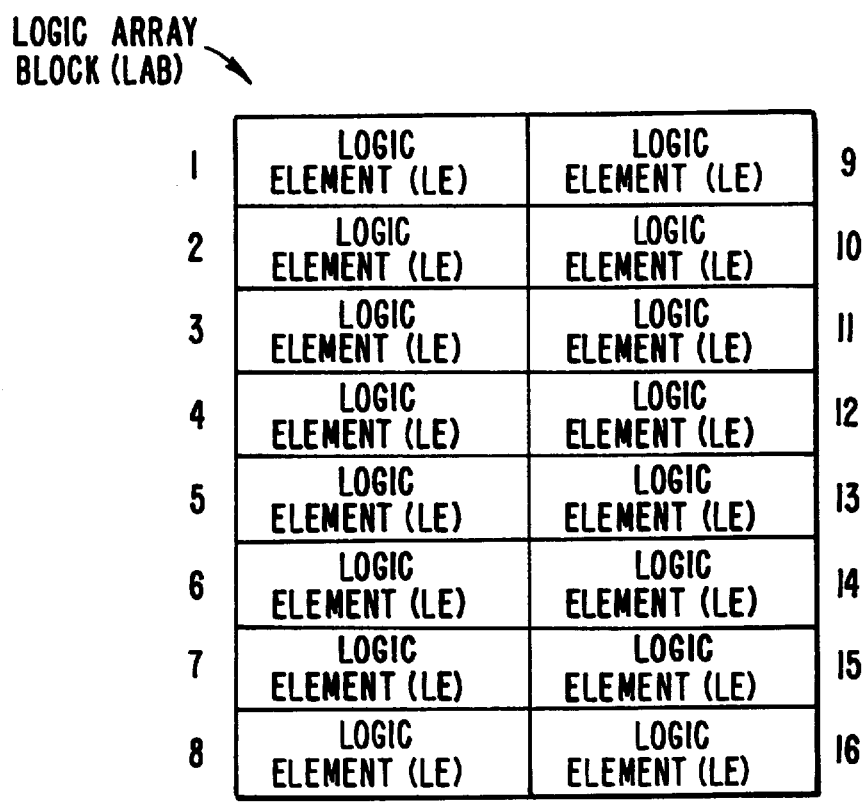

FIG. 1A shows a block diagram of a single logic array block. This logic array block has eight logic element positions. Other logic array blocks of this type may have eight or fewer logic element positions. In some programmable logic devices, such as shown in FIG. 1B, each logic array block has sixteen logic element positions. Moreover, in other programmable logic devices, each logic array block has sixteen logic element positions, but these sixteen positions are split into two halves, each half having eight logic element positions, where logic elements in position 8 and position 9 cannot be chained to each other. This configuration is analogous to having two separate banks of eight logic elements each. Some programmable devices may have a combination of the logic array blocks shown in FIGS. 1A and 1B. The methods described herein and shown in FIGS. 3 and 4 will take into consideration and handle logic array block configurations shown in FIGS. 1A and 1B, as well as other related configurations.

Different sizes of programmable logic devices exist, each having a varying number of logic array blocks. Some programmable logic devices have 8 logic array blocks and others have over 150 logic array blocks. In the future, as technology improves, programmable logic devices with even greater number of logic array blocks will undoubtedly exist. The methods described herein apply to programmable logic devices regardless of their size. Furthermore, the techniques described will also apply to other types of logic integrated circuits such as application specific integrated circuits (ASICs). For example, the present invention may be applied to gate arrays or standard cells (types of ASICs), which are functionally similar to programmable logic devices, but are different because they are generally larger and lack field programmability.

Figure 2:
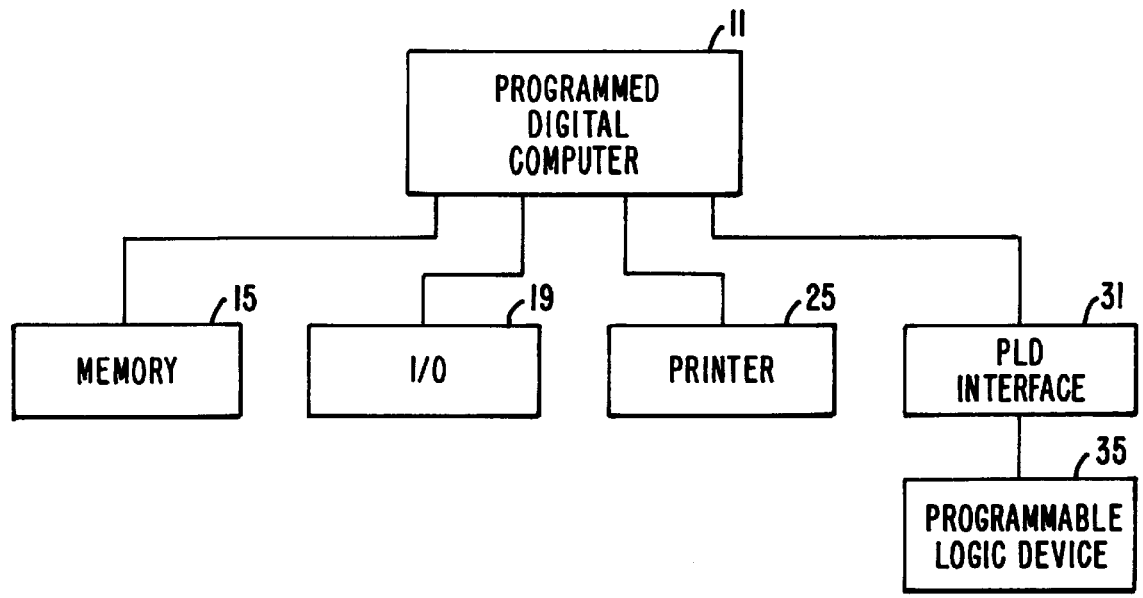
FIG. 2 is a block diagram of a system including a programmed digital computer for programming a programmable logic device.

FIG. 2 shows a block diagram of a system, within which the present invention may be embodied, for programming a programmable logic device. A programmed digital computer 11 is coupled to a memory 15, I/O 19, printer 25, PLD interface 31. Through PLD interface 31, a programmable logic device 35 is coupled to programmed digital computer 11. Programmed digital computer 11 may be a general purpose computer, a special purpose computer optimized for programming chains into a programmable logic device, or a combination of a general purpose computer and auxiliary special purpose hardware.

Programmed digital computer 11 may process or execute a program, stored in memory 15 or input using I/O 19, for programming chains into a programmable logic device. For example, provided in Appendix A is a portion of the MAX+PLUS® II development system source code in C programming language, which is an implementation of an embodiment of the present invention for a general purpose computer. This source code contains the functions, subroutines, and other routines necessary to implement the present invention on programmed digital computer 11. This source code may be stored in memory 15, compiled into machine language, and executed by programmed digital computer 11. In the alternative, only the machine language representation of the source code, without the source code, may be stored in memory 15 for execution by digital computer 11.

Memory 15 may be a random access memory (RAM), read only memory (ROM), fixed or flexible disk drive, tape, or any other storage retrieval means, or any combination of these storage retrieval means. Programmed digital computer 11 has I/O 19 to provide an input and output path for user interaction. For example, a user may input logical functions for programming into programmable logic device 35. I/O 19 may be a keyboard, mouse, digitizing tablet, or other input or output means, or any combination of these means.

Printer 25 is for printing a hard copy of any programmed digital computer 11 output. For example, a user may print out a copy of the source code or the logical functions input into programmed digital computer 11 via I/O 19.

PLD interface 31 is for interfacing programmable logic device 35 to programmed digital computer 11. Some programmed digital computers 11 have a PLD interface 31 built-in, so that programmable logic device 35 may be directly coupled to programmed digital computer 11. PLD interface 31 provides the proper adapters or sockets for coupling programmable logic device 35 to programmed digital computer 11. Furthermore, PLD interface 31 provides the proper voltages and electrical characteristics for coupling programmable logic device 35 to programmed digital computer 11. In one embodiment, programmed digital computer 11 directs PLD interface 31 to read data out of programmable logic device 35.

In another embodiment, PLD interface, is a programmer, which programs programmable logic device 35 under the direction of programmed digital computer 11. The design characteristics for programming into programmable logic device 35 may be input and processed by programmed digital computer 11. Then these design characteristics are transferred to PLD interface 31, which will program programmable logic device 35.

Figure 3:
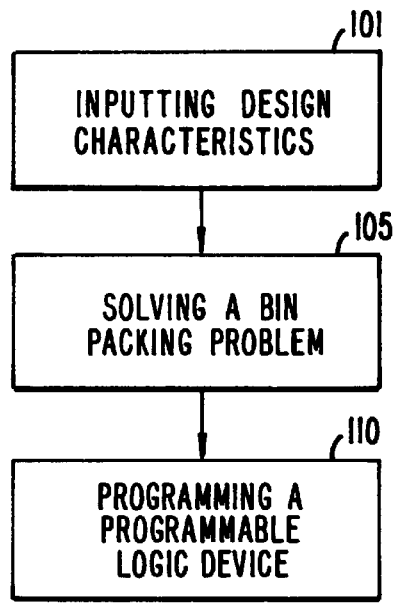
FIG. 3 is a flow diagram of a method of implementing logical functions in a programmable logic device.

FIG. 3 shows the overall method of the present invention of programming design characteristic into a programmable logic device. As described above, the flow in FIG. 3 may be performed on a general purpose computer, programmed digital computer, other computing machine specially adapted for programming design characteristics into a programmable logic device. In step 101, design characteristics are inputted. The design characteristics may have the form of a truth table, graphic design entry (or schematic), text design entry, waveform design entry, hierarchical design entry, or any other computer aided design format. These design characteristics may be input via a keyboard, mouse, digitizing tablet, floppy disk, hard or fixed disk, RAM memory, ROM memory, paper tape, punched cards, magnetic tape, or any other of a multitude of input or storage retrieval mediums. The design characteristics may be input into any appropriate processing mechanism including, among others, a computing machine. This computing machine may be a programmed digital computer; workstation; personal computer; special hardware-mechanical, electrical, or otherwise--designed or programmed to process the design characteristics; or any other machine capable of processing the design characteristics.

In step 105, a bin packing problem is solved. The bin packing problem may be solved by the same computing machine used in step 101 for the input of the design characteristics, or it may be solved by a wholly different computing machine, making use of the design characteristics inputted in step 101. To solve a bin packing problem, a computing machine takes chains of the design characteristics and places these in a logic array block of a programmable logic device in such a way that a minimum of programmable logic resources is wasted. In particular, when implementing design characteristics having chains, the computing machine will place each chain in a logic element position that will reduce the prevention of other chains from being placed in the available logic element positions of the logic array block. Further details on a method of solving a bin packing problem are given in the discussion of FIG. 4.

In one embodiment, the method of solving a bin packing problem is exhaustive. When exhaustive bin packing problem solving is used, a chain is placed in each logic element position of a logic array block to determine (or test) whether a placement in this position will prevent other chains from being placed in the same logic array block. In this fashion, each chain is tested in each logic element position repetitively until a substantially optimum solution is found. A substantially optimum solution occurs when the number of unused cells within the logic array block and within the entire programmable logic device is minimized. In other words, this solution substantially maximizes the number of chains placeable in a logic array block.

In a further embodiment of the present invention, the goal of the method of the present invention is improving the routability of the logic elements and logic array blocks within a programmable logic device. For example, the method of the present invention will place chains within a logic array block so that each placement reduces restrictions on the placement of future chains and also allowing full routability of the signals within the programmable logic device.

The method of the present invention need not be exhaustive; a partially optimum solution may be found without incurring the higher computing cost associated with an exhaustive approach. For example, a partially optimum solution may improve the utilization of logic elements by some percentage less than a substantially optimum solution. In other cases, a substantially optimum solution can be obtained without a full-blown exhaustive approach. For example, redundancies, symmetries, and the like in the arrangement of the logic elements may be accounted for to avoid the need for test-placing each chain in every logic element position.

In step 110, the programmable logic device is programmed with the design characteristics. The programmable logic device may be programmed using the same computing or other machine as in steps 101 or 105, or may be programmed using an entirely different machine, such as a dedicated programmer or special hardware in conjunction with a computing or other machine. The design characteristics and solution of the bin packing problem of step 105 may be transferred into the programmer device for programming of the programmable logic device. The programmable logic device will be programmed using the information determined in step 105, placing the chains into the logic array blocks and logic array elements of the programmable logic device in the same placements that were determined substantially or partially optimum in step 105.

Figure 4:
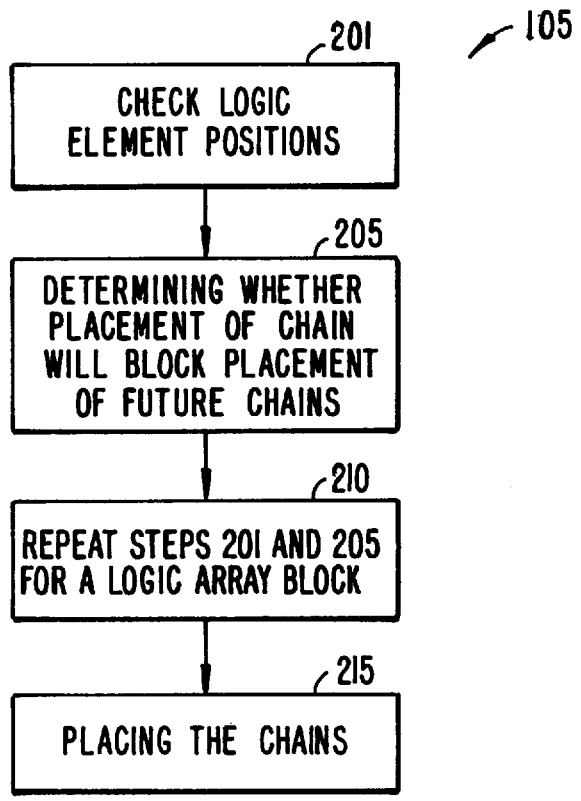
FIG. 4 is a flow diagram of a method of placing design characteristics having chains into a programmable logic device by solving a bin packing problem.

FIG. 4 is a more detailed flow diagram of step 105 of FIG. 3, a method of solving a bin packing problem. In step 201, one logic element position is checked, which means a chain is test-placed in a particular logic element position of a logic array block. When exhaustively solving a bin packing problem, step 201 test-places a chain into each and every logic element position of a logic array block. However, in many cases an exhaustive approach need not be used, and not all logic element positions must be test-placed since some of the positions are redundant. For example, since some of the positions of the logic elements are mirror images of another, these need not be tested because they are symmetric to logic element positions already checked previously.

Furthermore, in one embodiment, step 201 proceeds serially, where each logic element position is tested sequentially, one at a time. For example, a chain is placed into the first logic element position and tested, then the same chain is placed into a second logic element position and tested, and so forth until all logic element positions are tested. In other embodiments, however, step 201 needs not proceed serially, but may check logic element positions in another orderly fashion.

Step 205 determines whether the placement of a particular chain will block or prevent placements of future chains. For each logic element positions checked in step 201, step 205 will determine whether placing a chain in that particular logic element position blocks the placement of future chains. If this placement blocks more chains than other placements, the chain will not be placed in this logic block position. A more detailed description of an approach for step 205 is given in the discussion of FIG. 3.

Step 210 repeats steps 201 and 205 until a placement of the chains in the logic array block is found so the LAB is substantially occupied. Substantially occupied, however, does not mean all logic element positions in the logic array block need to be occupied; some unoccupied logic element positions may remain. For example, if a chain has three cells, another chain has four cells, and a logic array block has a total of eight logic element positions, then both the chain of three and the chain of four will be placed in this particular logic array block, with one logic element position remaining unoccupied; this situation will still satisfy the criteria of being substantially occupied in step 210.

Step 210 also minimizes the number of logic array blocks used by the design characteristics. Hence, the present invention is part of a process of selecting which programmable logic device size to use. In one particular embodiment, the present invention is part of a process of minimizing the size of the programmable logic device selected for a programmable logic device design. Since programmable logic devices with fewer logic array blocks generally also have a higher operating speed, in another embodiment of the present invention, the present invention is a method of increasing the operating speed of a programmable logic device design.

Step 215 places the chains in the logic element positions that were determined in steps 201, 205, and 210. At this point, the programmable logic device may be programmed, as in step 110 of FIG. 3. In other embodiments, another computing machine may process the chain placements for further optimization of the design characteristics.

The method in the flow diagram shown in FIG. 4 may be used alone or it may be part of a larger flow, such as shown in FIG. 3. Moreover, the method shown in FIG. 4 may even be a part of a much larger process such as designing an entire computer system like the one shown in FIG. 2.

Figure 5:
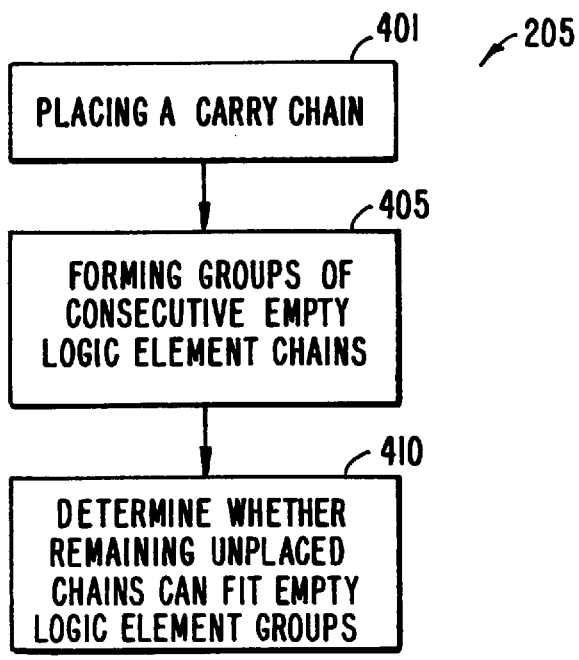
FIG. 5 is a flow diagram of a method for determining whether a placement of a chain will block placements of future chains.

FIG. 5 is a flow diagram of an embodiment of step 205 of FIG. 4, determining whether the placement of a particular chain will block or prevent placements of future chains. In step 401, a carry chain is placed in a particular logic element position of a logic array block of a programmable logic device. Step 405 forms groups of consecutive empty logic element chains. For example, if a chain of four elements is placed in positions 3, 4, 5, and 6 of a logic array block with eight logic elements, then there will be two empty chains of two logic elements each. Therefore, step 405 finds these two empty chains at positions 1 and 2 and positions 7 and 8.

Step 410 determines whether the remaining chains to be placed can fit into the empty logic element groups. Continuing the previous example, if there were an unplaced chain of three cells, then this particular chain cannot be placed in either of the logic element positions starting at logic element position 1 or 7. Step 410 compares this chain placement against previous test-placements. If there was a better placement previously, then this placement is discarded, otherwise this placement is stored until a better one is found. Steps 401 and 410 are repeated (in step 210 of FIG. 4) until all or substantially all the logic element positions are tested. In the end, for the above example, since the chain of three cells cannot be placed, step 410 determines that starting the placement of the four-element chain at position 3 of the particular logic array block is not a preferred or optimum placement since position 1 would be better. Then steps 401 and 410 prevent the placement of a four-element chain at logic element position 3. Instead, step 210 finds a preferred or optimum placement at logic element position 1, which is determined by repeatedly iterating through steps 201, 205, and 210. This preferred or substantially optimum placement of the chains is later programmed into the programmable logic device, as in step 215.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

APPENDIX A
Max+PLUS® II Source Code Files
© Copyright, Unpublished Work
Altera Corporation
All Rights Reserved

```
/******************************************************************
*/ int mux_bin_cmp
(
        const int *value1,
        const int *value2
)

/*      Description:  This function compares two integers for use
        with ge_qsort().

*/
/*      Returns:   0 if value1 = value2

-1 if value1 > value2

1 if value1 < value2
*/
/*
*/
/******************************************************************
*/
{
        int compare = 0;

if (*value1 < *value2)
        {
                compare = 1;
        }
        else if (*value1 > *value2)
        {
                compare = -1;
        } return compare;
}

/******************************************************************
*/ int mux_remove_small_bins
(
        int bins[MAX_MCELLS_PER_LAB + 1],
        int size_bin,
        int smallest      /* The size of the smallest group */
)

/*      Description:  This function removes all bins smaller than
        the smallest group since we can not break groups.  In other
        words, remove all bins of size less than the value of the
        'smallest' parameter.
*/
```

```
/*      Returns:  The new size of the bins[] array.
*/

/******************************************************************
*/
{
        int new_size = size_bin;
        int i;
        BOOL done = FALSE;

for (i = size_bin - 1; (i >= 1) && !done; i--)
        {
                if (smallest > bins[i])
                {
                        bins[0] -= bins[i];
                                        /* Fix the total capacity */
                        bins[i] = 0;
                        new_size--;
                }
                else
                {
                        done = TRUE;
                }
        } return new_size;
}

/******************************************************************
*/ void mux_remove_exact_fits
(
        int bins[MAX_MCELLS_PER_LAB + 1],
        int groups[MAX_MCELLS_PER_LAB + 1],
        int *size_bin,  /* Size of bins and groups might change
*/
        int *size_group
)

/*   Description:    This function removes from the groups and
     bins exact fits all groups that can be placed exactly into a
     corresponding bin are placed and removed.
*/

/*      Returns:              Nothing.
*/

/******************************************************************
*/
{
        BOOL done = FALSE;
        int new_size = 1;
        int temp_arr[MAX_MCELLS_PER_LAB + 1];
```

```
        /* Used to remove zeros from arrays */
        BOOL del_bin = FALSE;   /* Just to check if any matches
occured */
        int i = 0;

/* Skip the zeros location which is the total capacity */
        int group_loc = 1;
        int bin_loc = 1;

while ((group_loc != *size_group) && (bin_loc !=
*size_bin) &&
!done)
        {
                if (groups[group_loc] == bins[bin_loc])
                {
                        /* FOUND an exact match */
                        groups[0] -= groups[group_loc];   /*
Decrease the total capacity */
                        bins[0] -= bins[bin_loc];

/* Clear the locations to zero */
                        groups[group_loc] = 0;
                        bins[bin_loc] = 0;

del_bin = TRUE;
        /* There has been a match */

/* If there are no more groups or bins left then finish */
                        if ((bins[0] == 0) || (groups[0] == 0))
                        {
                                done = TRUE;
                        } group_loc++;
                        bin_loc++;
                }

/* The lists are sorted, if the group is larger than the bin
        get the next group otherwise check the next bin */
                else if (groups[group_loc] > bins[bin_loc])
                {
                        group_loc++;
                }
                else
                {
                        bin_loc++;
                }

}

/* we need to remove all empty bins and empty groups from the
arrays */
```

```
/* Just remove them by using a temporary array where all non_zero
   entries are copied. Update the length of the teo array */
        if (del_bin)
        {
                new_size = 1;
                temp_arr[0] = groups[0];

for (i = 1; i < (*size_group); i++)
                {
                        if (groups[i] != 0)
                        {
                                temp_arr[new_size++] = groups[i];
                        }
                } memcpy(groups, temp_arr, new_size *
sizeof(groups[0]));

*size_group = new_size;
                new_size = 1;
                temp_arr[0] = bins[0];

for (i = 1; i < (*size_bin); i++)
                {
                        if (bins[i] != 0)
                        {
                                temp_arr[new_size++] = bins[i];
                        }
                } memcpy(bins, temp_arr, new_size *
sizeof(bins[0]));
                *size_bin = new_size;
        }
}
/**************************************************************
*/ void mux_place_groups_loc
(
        int bins[MAX_MCELLS_PER_LAB + 1],
        int groups[MAX_MCELLS_PER_LAB + 1],
        int *size_bin,          /* the size might change */
        int *size_group,
        int loc      /* location of bin to place the first element
*/
)

*/
/*   Description:    This procedure attempts to place the first
     element of the groups array into the bin numbered "loc". It
     places the group if the bin has enough capacity. After
```

```
      placement the total capacities are adjusted and the now
      placed group is removed from the group list.
*/
/*      Returns:                    Nothing.
*/
/*****************************************************************
*/
{
        int temp_arr[MAX_MCELLS_PER_LAB + 1];

/* Temporary array to remove zeros */

/* from the groups array after placing */ size_bin = size_bin;

/* If there is enough capacity in the bin at location "loc" */
        if (groups[1] < bins[loc])
        {
                bins[loc] -= groups[1];    /* Decrease the
capacity of the bin */
                bins[0] -= groups[1];      /* Decrease the total
capacities */
                groups[0] -= groups[1];
                groups[1] = 0;             /* Clear the group
*/
        }

(*size_group)--;

/* Only remove the used group if there are any groups left */
        if (*size_group > 1)
        {
                memcpy(&(temp_arr[1]), &(groups[2]),
                       ((*size_group - 1)) *
sizeof(temp_arr[0]));

temp_arr[0] = groups[0];

memcpy(groups, temp_arr, (*size_group) *
sizeof(groups[0]));
        }
}

/*****************************************************************
*/

BOOL mux_fit_try
(
        int bins[MAX_MCELLS_PER_LAB + 1],
        int groups[MAX_MCELLS_PER_LAB + 1],
        int size_bin,
        int size_group
)
```

```
/*      Description:    This function tries to solve a problem
        similar to a bin packing problem. Given a set of groups each
        group with a capacity k. Can I fit those groups integrally
        into a set of bins each with capacity 1.
*/
/*      At this point, the bins and groups are expected to be    */
/*      sorted.
 */
/*      The function requires that bins [0] contains the total   */
/*      capacity of the bins = sum of bins[1] to                 */
/*      bins[size_bin -1]. Similarly for groups.                 */

/*      Returns:        TRUE for a succesful fit and FALSE otherwise
*/
/***************************************************************
*/
{
        BOOL success = FALSE;   /* return value of the function */
        int old_tot = 0;        /* Used to quick check if a
placement */

/* changed the capacity */
        int num_bins = 0;       /* save the size of the bins array
*/
        int i = 0;
        BOOL done = FALSE;
        int save_bin = 0;       /* Saves the value of the bin to
skip */

/* Identical bins */
            int new_bin[MAX_MCELLS_PER_LAB + 1];

/* Saves a copy of bins array */

/* Recurse on the copy */
            int new_group[MAX_MCELLS_PER_LAB + 1];

/* Same but for the group array */
            int newb_size = 0;  /* New size of the bin array */
            int newg_size = 0;  /* New size of the group array */

/* Location [0] of the bins and the groups arrays holds the total
   capacity of the arrays = the sum of all the elements in the
   array
*/

/* Remove all bins that are smaller than the smallest group
   element */
/* This is correct since we can not divide groups. They have to
stay */
        /* as integral elements */
        size_bin = mux_remove_small_bins(bins, size_bin,
groups[size_group-1]);
```

```
/* If all of the bins have been deleted OR Capacity of groups is
now higher than the capacity of the bins then FAIL */
        if ((bins[0] == 0) || (groups[0] > bins[0]))
        {
                success = FALSE;
        }

/* Capacity is statisfied so if we have only one bin left then we
can fit all the groups left in that bin, therefore SUCCESS */
        else if (size_bin == 2)
        {
                success = TRUE;
        }
        else
        {
/* We can always fit a group that fits exactly into a bin so
we remove all exact fits from the bins and groups */
                mux_remove_exact_fits(bins, groups, &size_bin,
&size_group);

/* if we have used up all the bins */
                if (bins[0] == 0)
                {
   /* If all the groups are not used up then FAIL else SUCCESS */
                        success = (groups[0] != 0) ?  FALSE :
TRUE;
                }

/* If all of the remaining groups can fit into the largest
       bin, */
                /* then we have SUCCESS. */
                else if (groups[0] <= bins[1])
                {
                        success = TRUE;
                }

/* If the groups are now larger than the bins */
                /* (i.e., capacity not satisfied) then FAIL. */
                else if (groups[0] > bins[0])
                {
                        success = FALSE;
                }
                else
                {
                        /* ENTERING recursion loop to try to
place groups in
bins */
                        /* and recurse to solve the new problem
*/
                        done = FALSE;
                        num_bins = size_bin;    /* Save the total
number of bins */
                        save_bin = -1;
```

```
                        for (i = 1; (i < num_bins) && (!done);
i++)
                   {
    /* Bins with the same capacity are  identical */
    /* Since the list is always sorted just skip the bins */
    /* that have the same capacity of the bins we have already
*/
                                /* tried */
                                if (bins[i] != save_bin)
                                {
                                        save_bin = bins[i];
    /* Save the trial bin */
                                        old_tot = bins[0];
    /* Save the currect capacity */

/* Copy the arrays to manipulate them in the recursion */
                                        memcpy(new_bin, bins,
sizeof(new_bin));
                                        memcpy(new_group, groups,
sizeof(new_group));
                                        newb_size = size_bin;
                                        newg_size = size_group;

/* place the first group member into bin i */
       /* This will create a new problem to recurse on */ mux_place_groups_loc(new_bin,
new_group,
                                                        &newb_size,
&newg_size, i);

/* If there are no more groups to place then SUCCESS*/
                                        if (new_group[0] == 0)
                                        {
                                                success = TRUE;
                                                done = TRUE;
                                        }

/* If there are no more bins then FAIL */
                                        else if (new_bin[0] == 0)
                                        {
                                                success = FALSE;
                                                done = TRUE;
                                        }

/* If the capacity of the bins has changed */
       /* Which means my placement was successful */
                                        else if (new_bin[0] !=
old_tot)
                                        {
       /* Resort the list and remove lagging zeros which */
       /* are empty bins. */ ge_qsort(&(new_bin[1]),
```

```
                        newb_size - 1, sizeof(new_bin[0]),
                mux_bin_cmp);
                                                                if
                (new_bin[newb_size-1] ==
                0)
                                                                { newb_size--;
                                                                }
                        /* Recurse on the NEW set of groups and bins */
                                                                if
                (mux_fit_try(new_bin,
                new_group, newb_size, newg_size))
                                                                {
                                                                        success =
TRUE;
                                                                        done =
TRUE;
                                                                }
                                                        }
                                                        else
                                                        {
                                /* Could not place the first element in bin [i] */
                                /* Since the lists are sorted then I can not place */
                                /* it in location i+1 which means FAILURE */
                                                                success = FALSE;
                                                                done = TRUE;
                                                        }
                                                }
                                        }
                                }
                        } return success;
        }
/****************************************************************
*/
/*

*/
BOOL mux_do_groups_fit_in_bins
(
        int bins[MAX_MCELLS_PER_LAB + 1],
        int groups[MAX_MCELLS_PER_LAB + 1],
```

```
              int number_of_bins,
              int number_of_groups
)
/*    Description:    This function tries to solve a problem
      similar to a */
/*    bin packing problem. Given a set of groups each group    */
/*    with a capacity k. Can I fit those groups integrally     */
/*    into a set of bins each with capacity 1.                 */
/*    This function just sorts the bins and groups and         */
/*    calls fit_try which solves the problem recursively
*/
/*    The function requires that bins[0] contains the total    */
/*    capacity of the bins = sum of bins[1] to
*/
/*    bins[size_bin - 1]. Similarly for groups.
*/
/*    Returns:    TRUE for a succesful fit and FALSE otherwise.
*/
/************************************************************
*/
{
        BOOL success = FALSE;

/* bins[0] and groups[0] contain the total so sort the array */
   /* from 1 to size_bin-1 instead of 0 to size_bin -1 */
        ge_qsort(&(bins[1]), number_of_bins, sizeof(bins[0]),
mux_bin_cmp);
        ge_qsort(&(groups[1]), number_of_groups, sizeof(bins[0]),
mux_bin_cmp);

success = mux_fit_try(bins, groups,
                number_of_bins + 1, number_of_groups + 1);

return success;
}
```

What is claimed is:

1. A method of implementing logical functions in a programmable logic device comprising the steps of:
   inputting design characteristics, said design characteristics defining a plurality of chains wherein a chain is a group of linked circuit elements, into a programmed digital computer;
   in said programmed digital computer, solving a bin packing problem for said design characteristics after chain placement, each bin comprising a plurality of logic elements linked in a linear fashion, wherein a routing of said logic elements is predetermined;
   programming said programmable logic device with a result of said solving step; and
   using said programmable logic device to implement said logical functions.

2. The method of claim 1 wherein said step of solving a bin packing problem is exhaustive.

3. The method of claim 1 wherein said step of solving a bin packing problem comprises:
   determining whether placing a chain of said design characteristics at one of a plurality of logic element positions will block future chains from being placed.

4. The method of claim 3 further comprising the step of:
   repeating said determining step until a number of chains placeable in a logic array block is substantially maximized.

5. The method of claim 3 further comprising the step of:
   repeating said determining step until said plurality of logic element positions in a logic array block are substantially occupied.

6. A method for programming a programmable logic device, having a plurality of logic array blocks, each logic array block comprising a plurality of logic elements, comprising the steps of:
   inputting design characteristics, said design characteristics defining a plurality of chains, into a programmed digital computer;
   in said programmed digital computer, determining whether placing a chain of said design characteristics at one of a plurality of logic element positions in a logic array block of said plurality of logic array blocks will block future chains from being placed in said logic array block, wherein said logic array block comprises a plurality of logic element positions organized in a linear linked structure having predetermined routing;
   repeating said determining step for said plurality of logic element positions in said logic array block; and
   programming said programmable logic device with a result of said repeating step.

7. The method of claim 6 wherein said determining step comprises the steps of:
   forming groups of consecutive empty logic element chains of a logic array block when a chain of said plurality of chains is placed at one of a plurality of logic element positions; and
   determining whether remaining chains of said plurality of chains can fit into said groups of consecutive empty logic element chains of said logic array block.

8. The method of claim 7 further wherein said determining step comprises:
   comparing a first size of said groups of consecutive empty logic element chains resulting from said forming step against a second size of said groups of consecutive empty logic element chains resulting from a previous forming step; and
   storing a logic element position for a smaller of said first size and said second size resulting from said comparing step.

9. A method of programming a programmable logic device comprising the steps of:
   inputting design characteristics, said design characteristics comprising a plurality of chains, into a computing machine;
   forming groups of consecutive empty logic element chains for said logic array block when a chain of said plurality of chains is placed at a logic element position of a plurality of logic element positions in said logic array block;
   determining whether remaining carry chains of said plurality of chains can fit into said groups of consecutive empty logic element chains of said logic array block, wherein said logic array block comprises a plurality of logic element positions organized in a linear linked structure having predetermined routing;
   repeating said forming and determining steps until said plurality of logic element positions in said logic array block are substantially occupied; and
   programming said programmable logic device with a result of said repeating step.

10. The method of claims 4, 5, 6, or 9 wherein said logic array block has eight or less logic elements.

11. The method of claims 4, 5, 6, or 9 wherein said logic array block has sixteen logic elements.

12. The method of claims 4, 5, 6, or 9 wherein said logic array block has at least two groups of eight or less elements.

13. The method of claims 3, 6, 7, or 9 wherein said determining step is performed serially.

14. The method of claim 1 wherein said programming step comprises:
   based on a result of said solving step, using said programmed digital computer, selecting a size of programmable logic device; and
   programming said selected programmable logic device with said result of said solving step.

15. The method of claim 1 wherein said programming step comprises:
   based on a result of said solving step, using said programmed digital computer, selecting a particular programmable logic device to increase an operating speed of said design characteristics; and
   programming said selected particular programmable logic device with said result of said solving step.

16. The method of claims 3, 6, or 9 wherein said programming step comprises:
   based on a result of said determining step, selecting a size of programmable logic device; and
   programming said selected programmable logic device with said result of said determining step.

17. The method of claims 3, 6, or 9 wherein said programming step comprises:
   based on a result of said determining step, selecting a particular programmable logic device to increase an operating speed of said design characteristics; and
   programming said selected particular programmable logic device with said result of said determining step.

18. The method of claim 3 further comprising the step of:
   repeating said determining step until signals in said programmable logic device are routable.

19. The method of claim 3 further comprising the step of:
   repeating said determining step until a number of chains placeable in a logic array block is substantially maximized and signals in said programmable logic device are routable.

20. The method of claim 3 further comprising the step of:
repeating said determining step until said plurality of logic element positions in a logic array block are substantially occupied and signals in said programmable logic device are routable.

21. A computer program product comprising computer usable medium having computer readable code embodied therein for causing the implementation of chains in a programmable integrated circuit, said computer program product comprising:
computer readable code device configured to cause a computer to effect inputting design characteristics defining a plurality of chains wherein a chain is a group of linked circuit elements;
computer readable code device configured to cause a computer to effect solving a bin packing problem for said design characteristics after chain placement, each bin comprising a plurality of logic elements linked in a linear fashion, wherein a routing of said logic elements is predetermined; and
computer readable code device configured to cause a computer to effect programming said programmable logic device with a result of solving said bin packing problem.

22. The computer program product of claim 21 wherein said computer readable code device configured to cause a computer to effect solving a bin packing problem for said design characteristics after chain placement comprises:
computer readable code device configured to cause a computer to effect determining whether placing a chain of said design characteristics at one of a plurality of logic element positions will block future chains from being placed.

23. The computer program product of claim 22 further comprising:
computer readable code device configured to cause a computer to effect repeating said determining step until a number of chains placeable in a logic array block is substantially maximized.

24. The computer program product of claim 22 further comprising:
computer readable code device configured to cause a computer to effect repeating said determining step until said plurality of logic element positions in a logic array block are substantially occupied.

25. A computer program product comprising computer usable medium having computer readable code embodied therein for causing the implementation of chains in a programmable integrated circuit, said computer program product comprising:
computer readable code device configured to cause a computer to effect inputting design characteristics, said design characteristics defining a plurality of chains;
computer readable code device configured to cause a computer to effect determining whether placing a chain of said design characteristics at one of a plurality of logic element positions in a logic array block of said plurality of logic array blocks will block future chains from being placed in said logic array block, wherein said logic array block comprises a plurality of logic element positions organized in a linear linked structure having predetermined routing; and
computer readable code device configured to cause a computer to effect repeating said determining step for said plurality of logic element positions in said logic array block.

26. The computer program product of claim 25 wherein said computer readable code device configured to cause a computer to effect solving a bin packing problem for said design characteristics after chain placement comprises:
computer readable code device configured to cause a computer to effect forming groups of consecutive empty logic element chains of a logic array block when a chain of said plurality of chains is placed at one of a plurality of logic element positions; and
computer readable code device configured to cause a computer to effect determining whether remaining chains of said plurality of chains can fit into said groups of consecutive empty logic element chains of said logic array block.

27. The computer program product of claim 26 wherein said computer readable code device configured to cause a computer to effect solving a bin packing problem for said design characteristics after chain placement comprises:
computer readable code device configured to cause a computer to effect comparing a first size of said groups of consecutive empty logic element chains resulting from said forming step against a second size of said groups of consecutive empty logic element chains resulting from a previous forming step; and
computer readable code device configured to cause a computer to effect storing a logic element position for a smaller of said first size and said second size resulting from said comparing step.

* * * * *